United States Patent [19]

Hirose et al.

[11] Patent Number: 5,506,816
[45] Date of Patent: Apr. 9, 1996

[54] MEMORY CELL ARRAY HAVING COMPACT WORD LINE ARRANGEMENT

[75] Inventors: Ryan T. Hirose; Loren T. Lancaster, both of Colorado Springs, Colo.

[73] Assignee: NVX Corporation, Colorado Springs, Colo.

[21] Appl. No.: 303,482

[22] Filed: Sep. 6, 1994

[51] Int. Cl.⁶ ........................................ G11C 8/00
[52] U.S. Cl. .................... 365/230.06; 365/230.03; 365/63
[58] Field of Search ................ 365/51, 63, 222, 365/230.06, 230.01, 230.03

[56] References Cited

U.S. PATENT DOCUMENTS

| | | | |
|---|---|---|---|
| 4,597,062 | 1/1986 | Asano et al. | 365/201 |
| 4,694,428 | 9/1987 | Matsumura et al. | 365/51 |
| 4,698,787 | 10/1987 | Mikher jee et al. | 365/185 |
| 4,747,083 | 5/1988 | Nakajima et al. | 365/230.06 |
| 4,758,993 | 7/1988 | Takemae | 365/222 |
| 4,805,150 | 2/1989 | Assno et al. | 365/230 |
| 4,819,207 | 4/1989 | Sakui et al. | 365/222 |
| 4,823,318 | 4/1989 | D'Arrigo et al. | 365/189 |
| 4,858,194 | 8/1994 | Terada et al. | 365/203 |
| 4,924,438 | 5/1990 | Kobatake | 365/185 |
| 4,962,481 | 10/1990 | Choi et al. | 365/185 |
| 5,018,108 | 5/1991 | Maruyama | 365/230.06 |
| 5,021,998 | 6/1991 | Suzuki et al. | 365/51 |
| 5,060,195 | 10/1991 | Gill et al. | 365/185 |
| 5,214,606 | 5/1993 | Hashimoto | 365/218 |
| 5,241,507 | 8/1993 | Fong | 365/218 |
| 5,245,570 | 9/1993 | Fazio et al. | 365/185 |
| 5,247,480 | 9/1993 | Itoh et al. | 365/189.09 |
| 5,253,206 | 10/1993 | Tanaka et al. | 365/189.09 |
| 5,282,175 | 1/1994 | Fujita et al. | 365/230.06 |

OTHER PUBLICATIONS

"A 5-V-Only 16-Mb Flash Memory with Sector Erase Mode" by Jinbo et al., *IEEE Jour. Solid State Circuits*, vol. 27, No. 11, Nov. 1992.

"A 3.3 V Single-Power-Supply 64 Mb Flash with Dynamic Bit-Line Latch (DBL) Programming Scheme", *IEEE International Solid-State Circuits Conference*, Feb. 1994.

*Primary Examiner*—Joseph A. Popek
*Attorney, Agent, or Firm*—Richard A. Bachand; Holland & Hart

[57] ABSTRACT

A semiconductor memory array having a plurality of rows of memory cells, a word line, which extends into at least two memory blocks, to carry drive signals, such as read select and deselect signals, erase select and deselect signals, and program select and deselect signals for selective delivery to a subword line. Two pairs of subword lines and associated drivers are arranged with each pair selectively connectible to a portion of the word line within the block containing the subword line pair and to an associated set of memory cells. Each subword line driver selectively delivers drive signals from the word line to a respective, selected one of the subword lines. The subword lines and their drivers are arranged to extend from opposite sides into the block with which the subword line pairs are associated to reduce the layout size necessary, and to enable fewer word line drivers to be needed for a particular layout pitch. A subword line driver (SWD) circuit has an NMOS transistor and a PMOS transistor, with the drain of the NMOS transistor and the source of the PMOS transistor connected to the word line, and the source of the NMOS transistor and the drain of the PMOS transistor connected to receive a word line selection signal from a common source line. The gate of the NMOS transistor is connected to a block select line that carries a "true" block select signal, and the gate of the PMOS transistor is connected to a block select line that carries a complement block signal.

42 Claims, 6 Drawing Sheets

MEMORY CELL ARRAY HAVING COMPACT WORD LINE ARRANGEMENT

BACKGROUND OF THE INVENTION

1. Field of the Invention

This invention relates to improvements in integrated circuit memory cell arrays, and more particularly to improvements in word line arrangements for memory cell arrays, to improvements in word line and subword line arrangements, and to improvements in subword line driver circuits and methods for using same.

2. Relevant Background

In the construction of semiconductor memory arrays, a number of individual memory cells are generally arranged in rows and columns. The term "row" is used to refer to the horizontally aligned memory cells served by a word line, and the term "column" is used to refer to the vertically aligned memory cells served by a bit line, although this nomenclature is arbitrary, and may be found in reversed form in the literature.

Typically, the word line is used to select or enable memory cells on the row in which the particular word line exists, and the bit line is used to select a cell at the intersection of the active word line row and the bit line column to carry an output signal representing the memory state of the cell that has been read, or to apply an input signal to be applied or written to the cell. The term "enabled" denotes the activation of a cell to a particular operational mode, such as reading, writing, or erasing. More particularly, during reading, writing, and erasing operations, each cell in the array may be either selected or deselected, with a particular desired operation performed on the selected cells, such as read, write, or erase.

As memory arrays become more and more dense, the array architecture is often broken down into blocks, with each block having its own set of memory cells and row and column lines. In some cell embodiments, for example, a number of blocks are contained in the memory array and are simultaneously read to provide a number of output bits on a plurality of output lines corresponding to a single multibit word contained in the memory.

A typical block oriented memory 10 of the prior art is shown in FIG. 1. The memory array 10 has two blocks, denoted "Block a" and "Block b". Generally, as shown, the blocks may be physically arranged horizontally with respect to each other in sets so that a word line extends horizontally across both (or a number of) blocks. It should be noted that sometimes second or more sets of horizontal blocks may be provided, commonly with the sets being vertically arranged with respect to each other.

Often in such block oriented memories, main word lines (MWLs) 11a–11d extend across both Block a and Block b to carry signals to enable or drive selected ones of several subword lines (SWL) 12a–12b to 15a–15b, where each SWL is on the same row but in different blocks in the array. For each MWL 11a–11d, a corresponding main word decoder/driver circuit (MWD) 25–28 is provided. Thus, as shown in FIG. 1, one MWD and an associated MWL are provided per row of cells (the MWL labels ending with small letters in the drawing to signify that each is unique and that they are sequential).

Generally, such block oriented memories have metal MWLs that can be selectively connected to one or more polysilicon SWLs, or to an intermediate SWL decoder/driver (SWD), such as the SWDs 17a–17b to 20a–20b shown. The connections and the SWD circuitry 17a–17b to 20a–20b may be oriented vertically, or orthogonally to the rows of the array.

Each SWL that is selected by its respective SWD has an associated number of memory cells, M, which it serves. Usually, the SWDs accept inputs from the MWLs and a block enabling signal, BLKa and BLKb (the lower case letter signifying which block the BLK is associated), on lines 30 and 31. The MWD and BLK signals allow each SWL to be separately enabled by the respective SWDs.

In some applications, the SWD circuitries 17a–20a to 17b–20b may be replaced with direct connections between the MWLs and all SWLs on the same row. In such cases, the BLK signals may not be necessary. The main reason that connections may be used instead of SWDs is to reduce the electrical resistance in the main row of cells by segmenting the main row of cells into sections of subrows of cells, allowing the MWL to be connected to the lower resistance SWLs. This implementation, however, does not allow the unique enabling of separate SWLs.

Depending on the technology in which such memory is built, the connections and the SWD circuitry can be larger than the row dimension, or pitch. However, this may become problematic, especially if the physical size of the memory cells on the row is very small. In addition, the MWDs 25–28 may be arranged side-by-side within the same tight row pitch. Thus, the MWDs, SWDs, the connections between the MWLs and the SWDs, and the SWDs and the SWLs may be done within the row pitch of the memory cells, and for very small memory cells, the scaling and circuit arrangement problems created can be significant.

SUMMARY OF THE INVENTION

In light of the above, therefore, it is an object of the invention to furnish an improved circuit for providing signals that can be decoded to operate a number of single-gate non-volatile memory cells on a single word line, or subword line, for the purposes of reading or altering the states stored in the non-volatile memory cells.

It is another object of the invention to provide a circuit of the type described that can be realized using a minimum device count.

It is yet another object of the invention to provide a circuit of the type described that can be used to drive decoded subword lines of memory array blocks that are a subset of the entire memory.

It is another object of the invention to provide a method for decoding signals to read or alter the states stored in a number of single-gate non-volatile memory cells on a single word line, or subword line.

It is yet another object of the invention to enable groups of adjacent subword lines to be provided while alleviating tight row pitch constraints.

It is still another object of the invention to provide an improved circuit to decode signals to operate single-gate non-volatile memory cells on a single word line or subword line for the purposes of reading or altering the states stored in the non-volatile memory cells.

It is yet another object of the invention to provide an improved subword line driver circuit.

These and other objects, features and advantages of the invention will be apparent to those skilled in the art from the following detailed description of the invention, when read in conjunction with the accompanying drawings and appended claims.

In accordance with a broad aspect of the invention, a semiconductor memory array is presented that has two memory blocks. Each memory block has a plurality of rows of memory cells. A word line extends into the two memory blocks, and a word line driver provides drive signals to the word line. The drive signals may be, for example, read select and deselect signals, erase select and deselect signals, and program select and deselect signals. Two pairs of subword lines are provided, each subword line of each pair being associated with memory cells of a respective one of the plurality of rows of memory cells in a respective one of the blocks. Two pairs of subword line drivers are also provided, each pair being connected to opposite ends of the word line within a respective one of the two blocks. Each subword line driver selectively delivers drive signals from the word line to a respective one of the subword lines. Each of a plurality of selection signal lines are connected to select a respective one of the subword line drivers to control delivery of drive signals from the word line to the respective one of the subword lines.

In one embodiment, the subword lines are located on opposite sides of the word line, with the selection signal lines oriented orthogonally to the word line at opposite ends of the word line within a respective one of the two blocks. (Notably, the subword lines may be located virtually anywhere, not just between SWL pairs, as required by the designer.)

The memory array may be expanded to further include two additional pairs of subword lines, with each subword line of each additional pair being associated with memory cells of a respective additional one of the plurality of rows of memory cells in a respective one of the blocks. Two additional pairs of subword line drivers are connected to opposite ends of the word line within a respective one of the two blocks, each additional subword line driver selectively delivering drive signals from the word line to a respective one of the additional subword lines. Each of an additional plurality of selection signal lines are connected to select a respective one of the additional subword line drivers to deliver drive signals from the word line to the respective additional one of the subword lines. In such structure, each subword line of each additional subword line pair, and each subword line driver of each additional subword line driver pair may be located on opposite sides of the word line.

According to another broad aspect of the invention, a subword line driver (SWD) circuit for use in a semiconductor memory array having at least two blocks of memory cells, a word line, a subword line, first and second block select lines, and a common source line is presented. The first block select line may be a true block select line and the second block select line à complement block select line, or vice versa. The SWD circuit has a first n-channel MOS (NMOS) transistor having a gate, a drain, and a source, and a first p-channel MOS transistor (PMOS) having a gate, a drain, and a source. The drain of the first NMOS transistor and the source of the first PMOS transistor are connected to the word line. The source of the first NMOS transistor and the drain of the first PMOS transistors are connected to receive a signal from the common source line. The gate of the first NMOS transistor is connected to the first block select line, and the gate of the first PMOS transistor is connected to the second block select line.

In yet another broad aspect of the invention, a subword line driver (SWD) circuit for use in a semiconductor memory array having at least two blocks of memory cells, a word line, a subword line, a block select line, a block complement select line, and a common source line is presented. The SWD circuit has first and second NMOS transistors, each having a gate, a drain, and a source, and first and second PMOS transistors, each having a gate, a drain, and a source. The drain of the first NMOS transistor and the source of the first PMOS transistor are connected to the word line. The source of the first NMOS transistor and the drain of the first PMOS transistor are connected to the respective source of the second PMOS transistor and the drain of the second NMOS transistor. The gates of the first NMOS transistor and second p-channel transistor are connected to the block select line, and the gates of the second NMOS transistor and first p-channel transistor are connected to the block complement select line.

If the memory cells are constructed in a well of p-type conductivity in a semiconductor substrate, separate connections may be provided to the well and to the channels of the first and second NMOS transistors. On the other hand, if the memory cells are constructed in a well of n-type conductivity in a semiconductor substrate, separate connections may be provided to the well and to the channels of the first and second PMOS transistors.

According to still yet another broad aspect of the invention, a semiconductor memory array is presented. The semiconductor memory array has two memory blocks, each having a plurality of rows of memory cells. A word line extends into each of the two memory blocks. A word line driver provides drive signals to the word line. Two pairs of subword lines are arranged with each subword line of each pair being associated with memory cells of a respective one of the plurality of rows of memory cells in a respective one of the blocks. Two pairs of subword line drivers are provided, each pair connected to opposite ends of the word line within a respective one of the two blocks, each subword line driver selectively delivering drive signals from the word line to a respective one of the subword lines. A plurality of selection signal lines are provided, each selection signal line connected to select a respective one of the subword line drivers to control delivery of drive signals from the word line to the respective one of the subword lines. Each of the subword drivers has first and second NMOS transistors, each having a gate, a drain, and a source, and first and second PMOS transistors, each having a gate, a drain, and a source. The drain of the first NMOS transistor and the source of the first PMOS transistor are connected to the word line, the source of the first NMOS transistor and the drain of the first PMOS transistor are connected to the respective source of the second PMOS transistor and the drain of the second NMOS transistor. The gates of the first NMOS transistor and second PMOS transistor are connected to one of the block selection lines. The gates of the second NMOS transistor and first p-channel transistor are connected to a complement selection line.

According to yet another broad aspect of the invention, a word line driver circuit for use in a semiconductor memory array having at least two blocks of memory cells is presented. The word line driver circuit has a first word line for supplying signals for delivery to a selected memory cell. A source line supplies signals for delivery to deselected memory cells. A first block select line carries true block select signals, and a second block select line carries complement block select signals. A second word line delivers signals from the first word line and the source line to a plurality of memory cells in the at least two blocks in dependence upon the true and complement block select signals of the first and second block select lines. The selection between the signals of the block select lines are made by first and second NMOS transistors, and first and second PMOS transistors. The drain of the first NMOS and the source of first PMOS transistors are connected to the first word line. The source of the first NMOS and the drain of the first PMOS transistors are connected to the second word line and to the drain respectively of the second NMOS and source of the second PMOS transistors. The gates of the first NMOS transistor and the second PMOS transistor are connected to the first block select line, and the gates of the first PMOS transistor and the second NMOS transistor being connected to the second block select line. The source of the second NMOS and drain of the second PMOS transistors are connected to the source line, whereby the second word line delivers signals from the first word line and the source line to the memory cells in dependence upon the true and complement block select signals of the first and second block select lines.

If the memory cells are constructed in a well of p-type conductivity, separate connections may be provided to the well and the channels of the NMOS transistors. On the other hand, if the memory cells are constructed in a well of n-type conductivity in a semiconductor substrate, separate connections may be provided to the well and to the channels of the PMOS transistors. Also, if the first word line is a main word line, the second word line may be a subword line. On the other hand, if the first word line is an enable signal line, and the second word line may be a main word line.

BRIEF DESCRIPTION OF THE DRAWING

The invention is illustrated in the accompanying drawing, in which.

In the various drawings, like reference numerals are used to denote like or similar parts. Additionally, the drawings are not necessarily drawn to scale.

DETAILED DESCRIPTION OF THE PREFERRED EMBODIMENTS

It should be noted that the memory structures herein described do not necessarily form a complete memory device. It is anticipated that the present invention may be practiced in conjunction with memory circuit fabrication techniques currently used in the art, and only so much of the commonly practiced process steps and circuit structure are included as are necessary for an understanding of the present invention.

Although the embodiments of the invention are described below with particular reference to non-volatile memory arrangements, this invention can be used generally in semiconductor memory arrays of all types, especially those that have an extremely tight row pitch. Such tight row pitch makes it difficult to devise circuitry to control and connect to the word lines or subword lines of the rows. This invention enables groups of adjacent subword lines to be provided while alleviating tight row pitch constraints.

Figure 1:
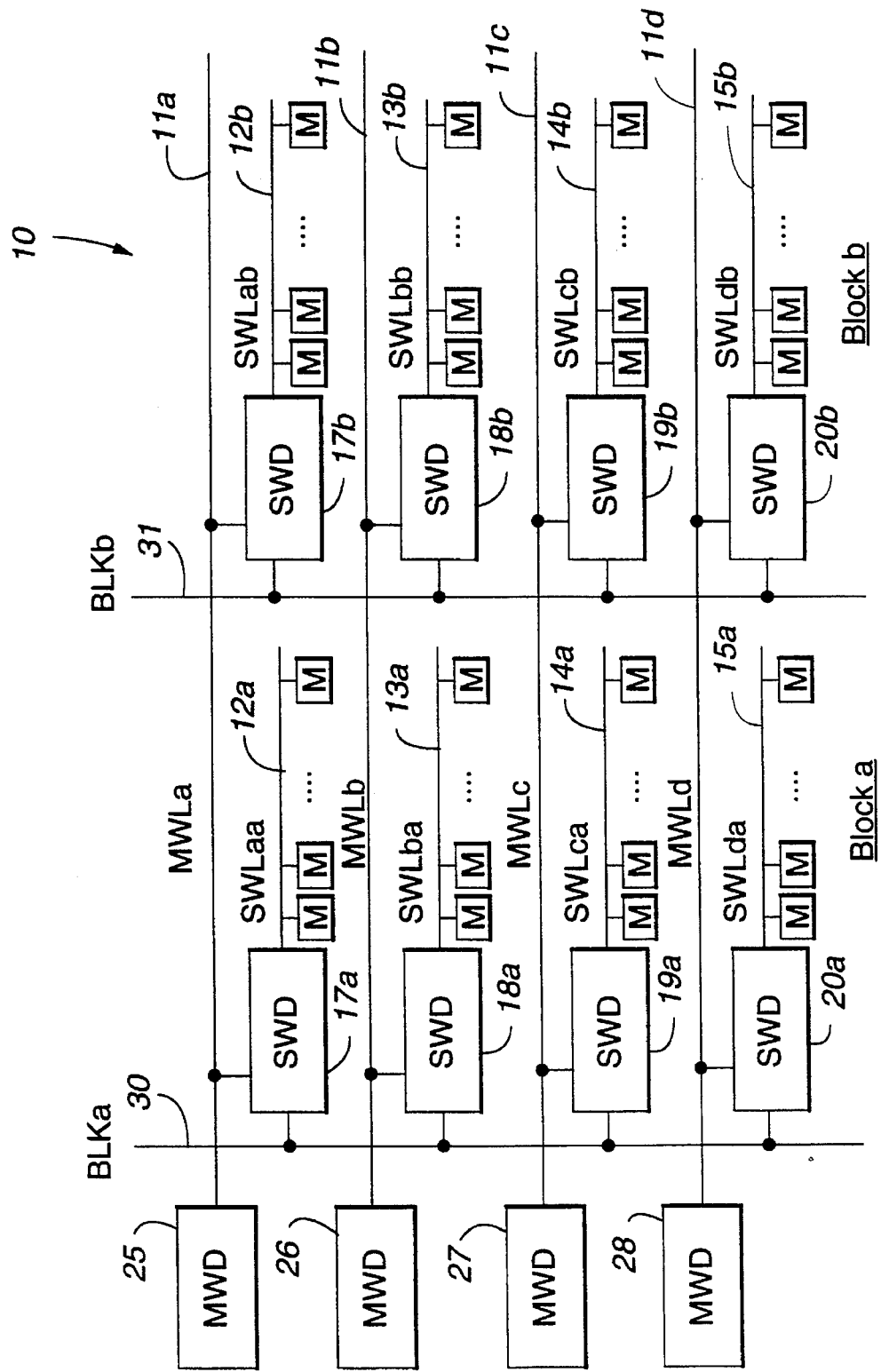
FIG. 1 is an electrical schematic block diagram of a typical memory array having two memory blocks, in accordance with the prior art.
Figure 2:
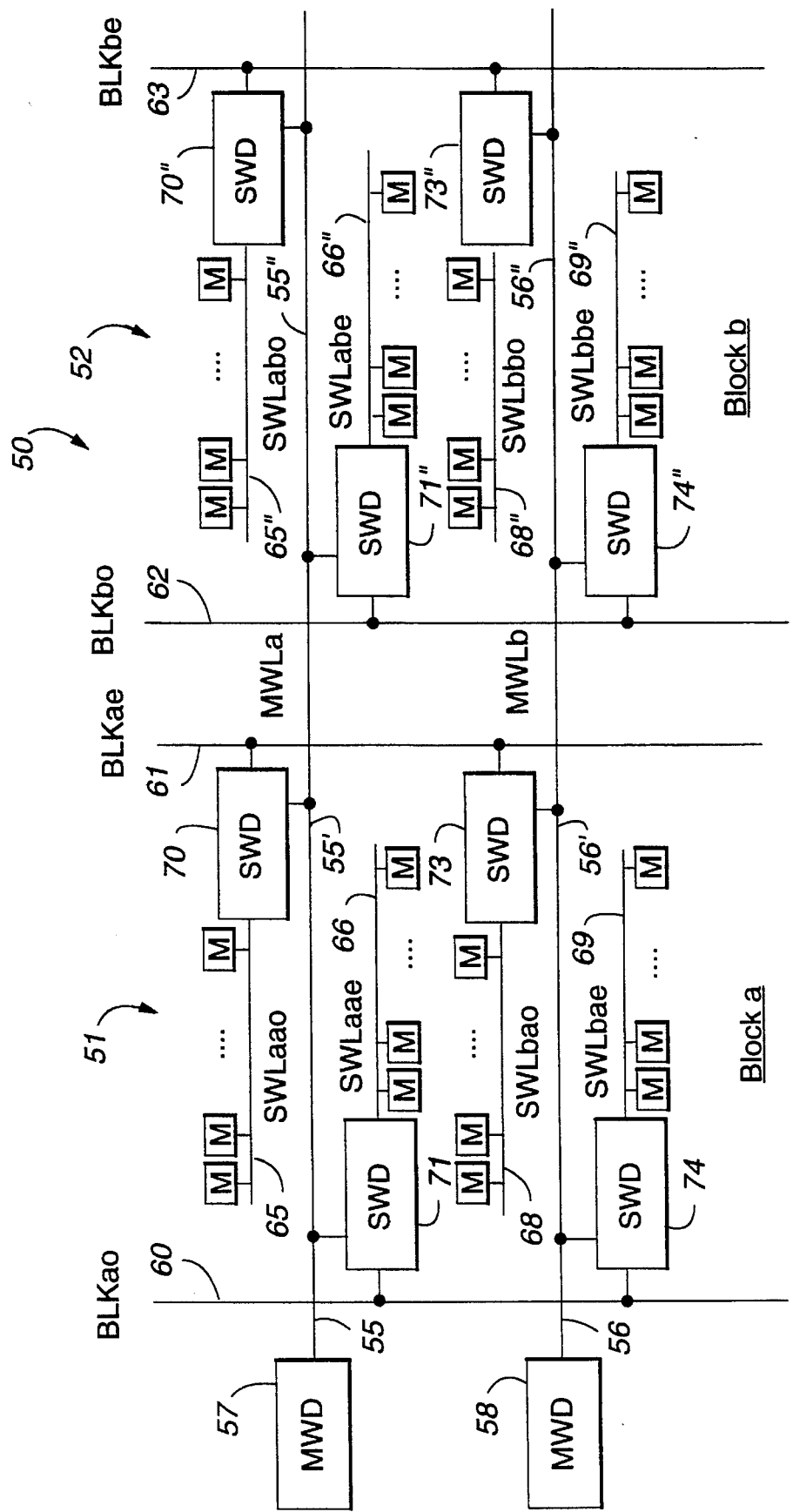
FIG. 2 is an electrical schematic diagram of a memory array in which the word lines and drivers have been abstracted, showing the word line, subword line, driver circuitry, and selection circuitry, in accordance with a preferred embodiment of the invention.

Thus, with reference now to FIG. 2, a portion 50 of a memory array is shown, illustrating a word line and subword line configuration in accordance with a preferred embodiment of the invention. The portion 50 of the memory array has two blocks 51 and 52, labeled as "Block a" and "Block b". Of course, any number of blocks may be provided in both the horizontal and vertical directions, if desired. Two MWLs 55 and 56 are provided, each extending across the respective blocks 51 and 52 as shown. MWD circuits 57 and 58 respectively provide drive signals to the MWLs 55 and 56. In contrast to the circuit of FIG. 1, two block selection lines 60 and 61 for block 51, and 62 and 63 for block 52 are provided. Selection signal lines 60 and 61 are physically located at opposite sides of the block 51 with which they are associated. Likewise, selection lines 62 and 63 are physically located at opposite sides of block 52 with which they are associated. Each of selection lines 60, 61, 62 and 63 may carry separate true and complement signals.

Each segment of the MWL within each block has an associated pair of SWL lines. Thus, for example, MWL line 55 has a portion 55' within block 51 and has an associated pair of SWLs, 65 and 66 on each side (top and bottom) thereof. Similarly, the portion 56' of MWL 56 within the block 51 has a pair of SWLs 68 and 69 associated therewith on each side (top and bottom) of it. The lines of block 52 are similarly constructed, being referenced by similar reference numerals as those of block 51, followed by a double prime (").

In addition, each SWL has its own associated SWD connected between it and a respective selection signal line. Thus, for example, SWL 65 is connected by SWD 70 to the segment 55' of MWL 55, as well as to the selection signal line 61. Similarly, the SWL 66 has an SWD 71 to selectively connect it to the segment 55' of the MWL 55 and to the selection signal line 60. Thus, the SWL 65 extends into the memory block 51 from the right hand side thereof, and, in contrast, the SWL 66 extends into the memory block 51 from the left hand side thereof. Although the SWD 70 and 71 and their associated SWLs 65 and 66 are shown located on respective opposite sides of the memory block 51 in which they are constructed, it should be noted that the SWDs and SWLs may be located, if desired, with appropriate circuit modifications, on the same side of the MWL with which they are associated.

Similar SWD circuits 73 and 74 are provided for the SWLs 68 and 69 associated with the segment 56' of the MWL 56, and similar SWD circuits are provided for the SWLs in block 52, those again being denoted by a double prime (") following the reference numeral thereto. Each of the SWLs 65–69 have a plurality of associated memory cells "M" physically located on the side of the SWL away from the MWL segment with which the SWLs are associated. It should be appreciated, of course, that other memory cell locations and MWL placements can be equally advantageously selected or employed.

Thus, in the SWD configuration of FIG. 2, adjacent SWLs are driven by SWDs that are physically located at different ends of the block with which the SWLs are associated, at opposite ends of the portion of the MWL that extends through the block. Each block has an additional BLK signal line, so that alternating SWDs vertically within each block are connected to respective opposite BLK selection signal lines. By doing this, each BLK line will be connected to every other SWD and its associated SWL. Additionally, the connections between the MWLs and the SWDs and the connections between the SWDs and the SWLs on each end of the block occur only every other SWL through the vertical space between the blocks. Consequently, if the MWLs are routed between every two rows of cells, M, with each SWL serving one row of cells M, and BLK signals are used to select the odd or even rows (denoted by "o" or "e" on the BLK signal lines shown), then only half the number of MWDs are required than, for example, the memory arrays of the prior art as exemplified by the memory portion of FIG. 1. Therefore, the MWD circuitry constructed according to the invention need only fit within a pitch of two rows.

With the arrangement shown in FIG. 2, straight connections from the MWLs to the SWLs are not preferred, since the SWDs are employed to select between odd and even SWLs. (The SWL labeling indicates first the MWL, then the block, and finally the odd/even designations.) It should be noted that although there is an extra block select signal (odd/even) per block compared to the prior art circuit described above with respect to FIG. 1, there is the same number of SWDs and SWLs, and only one half the number of MWDs and MWLs required to realize the circuit.

The same concept can also be applied to the MWDs by alternating the MWDs on opposite sides of the array. In such an arrangement, the MWDs may be placed in a pitch of four rows instead of two.

Figure 3:
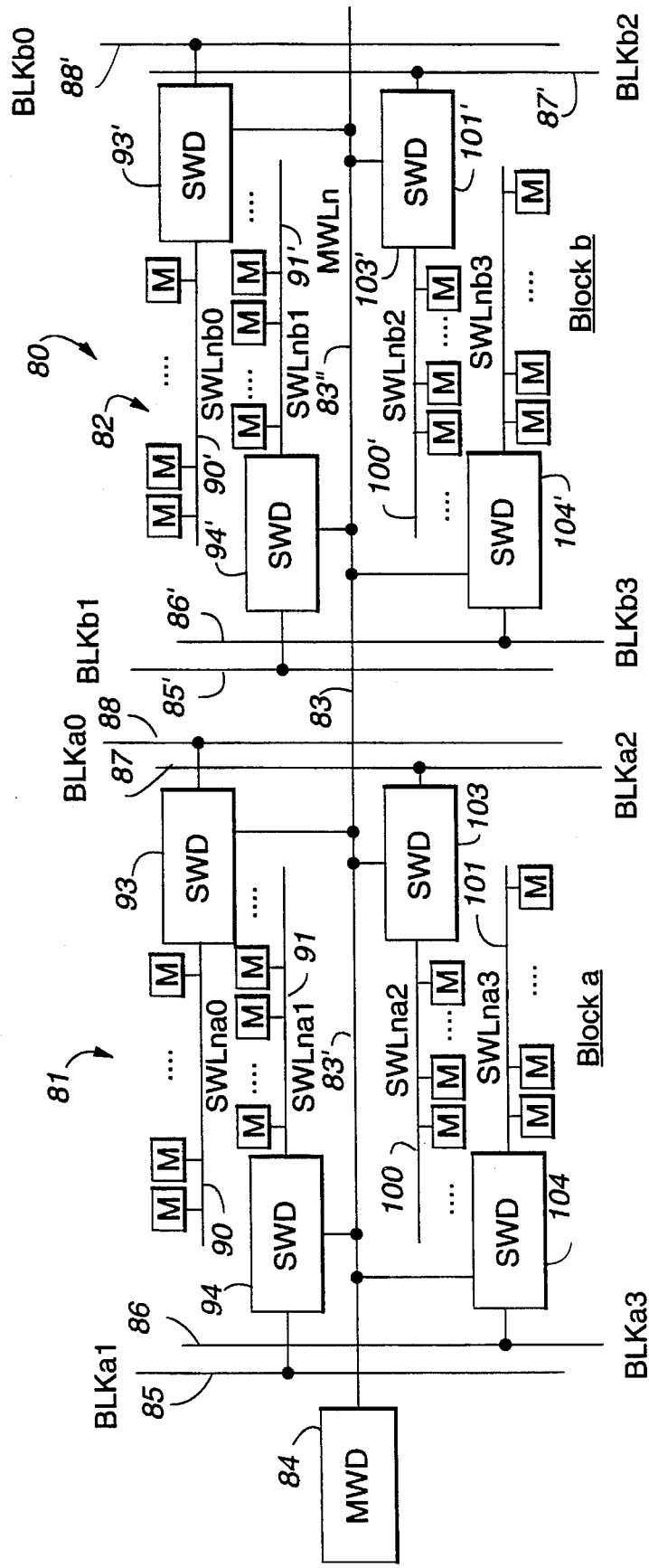
FIG. 3 is an electrical schematic diagram of another embodiment of a memory array showing the word line, subword line, driver circuitry, and selection circuitry in which each MWL enables groups of four SWLs in each block, in accordance with another preferred embodiment of the invention.

Another embodiment 80 of the invention is shown in FIG. 3, in which each MWL enables groups of four SWLs in each block. The circuit embodiment 80 has two blocks 81 and 82. Block 81 is denoted "Block a" and block 82 is denoted "Block b". Again, any number of blocks can be provided along vertical or horizontal lines. A single MWL 83 is provided, being driven by signals from the MWD 84. The MWL 83 extends across block 81 and into block 82. Within the block 81, four selection signal lines 85–88 are provided, arranged to run vertically along the columns of the memory array. Schematically, on the top side of the MWL 83, two SWLs 90 and 91 are provided, respectively controlled by signals from SWD circuits 93 and 94. The SWD circuit 93 is controlled by selection a signal on line 88, and, in a similar fashion, control signals are provided to SWL 91 by SWD circuit 94 which is connected to selection signal line 85. The lower half of the circuit in the block 81 is similarly constructed, with two SWL lines 100 and 101 controlled respectively by selection signals from SWD circuits 103 and 104. SWD circuit 103 is connected to the selection signal line 87, while the SWD circuit 104 is connected to the selection signal line 86. All of the SWDs are connected to the portion 83' of the MWL 83 within the block 81.

The circuit of block 82 is similarly constructed about the portion 83" of the MWL within the block 82. The remaining circuit components correspond to the components of the block 81, and are designated with similar reference numerals followed by a prime ('). In the memory array 80, the memory cells M are located, as shown, on the sides of the SWLs away from the MWL 83.

It should be noted that the SWDs 93 and 94 on the top of the portion 83' of the MWL 83 are arranged physically on opposite horizontal sides of the block 81 in which they are constructed to assist in conserving space within the memory array. Similarly, SWDs 103 and 104 are constructed physically on opposite horizontal sides of the block 81 on the bottom side of the portion 83' of the MWL 83. This embodiment may be advantageous when the MWD circuitry is needed that is too large to fit in a pitch of two rows and the space of four and even eight rows might be needed. Also, to efficiently fit the SWDs between the array blocks, more than the space of two rows may be required. Again, it should be noted that the MWL can be placed anywhere in the array.

As mentioned, in the embodiment 80 of FIG. 3, the MWL 83 enables a group of four SWLs, with the single MWL 83 spanning more than one array block. More particularly, the single MWL 83 enables a set of four SWLs 90–101 or 90'–101' in each block 81 or 82, and each of the four BLK signal lines 85–88 and 85'–88' per block enable a selected one of the four SWLs. The circuit 80 may be replicated many times to form an overall array; consequently, the MWL 83 is labeled MWLn and the SWLs are labeled to indicate first, which MWL group (n); second, which block (a or b); and third, which one of four SWL in a group is enabled. The selection signal lines 85–88 and 85'–88' are labelled with the legend "BLK" followed by a designation for the block, then the number of the SWL in a group it will be enabling. It will be appreciated, of course, that the selection signals on the lines 85–88, or 85'–88' may be separate true and complement signals.

It should be noted that even though the same number of SWDs exist in all the circuit embodiments above, the layout of the SWDs can be more efficient if the space in the row pitch is increased. For example, in the embodiment of FIG. 3 each SWD on the left and right of each array block within which it is constructed can be configured during the layout of the circuit to be four rows high with the two SWDs placed side by side horizontally. The space between the array blocks will thus have four SWDs across the space with each SWD being four rows high. Again, by alternating the MWDs on opposite sides of the array, the MWDs can be placed in a pitch of eight rows.

Thus, a method of reducing row pitch constraints is presented by first alternating the SWDs, and second by using block select signals in a block having one MWD and one MWL per group of two, four, eight or more rows.

As indicated this invention has general memory circuit application. However, non-volatile memories have particular considerations that may be specially addressed by providing SWD circuits that are presently described. Typically, for non-volatile memory cells that have two and even three gates that span in the row direction, the voltages that are applied to drive the various gates can be generated by individual circuits. These individual circuits may be designed to apply various voltages to the non-volatile memory cells to enable them to perform such complex functions as reading, erasing and programming. It can be seen, therefore, that when a single-gate non-volatile memory cell is employed, for example, to achieve small cell size, the circuitry that controls the single-gate assumes additional functions to apply voltages to perform the same functions as with the two and three gate non-volatile memory cells. Since these functions my be combined into a single circuit, the circuit can become very complex. Also, for efficient array architectures that take into account speed, power, and area utilization, this circuit desirably has the minimum device count needed to perform the required functions, and is able to drive decoded subword lines of memory array blocks that are a subset of the entire memory.

The minimum device count is also desirable to enable the circuit to fit into the row pitch of the memory array and not to take up too much area for a small size semiconductor memory chip. Usually, in memories of high densities (1 megabit or higher), the memory array needs to be broken into smaller blocks that turn on fewer cells to enhance speed and power. It is therefore desirable to provide a circuit to decode signals to operate the single-gate non-volatile memory cells on a single word line or subword line for the purposes of reading or altering the states stored in the non-volatile memory cells. The signals on the word line that may be decoded may include, for example, drive signals such as read select and deselect signals, erase select and deselect signals, and program select and deselect signals.

Figure 4A:
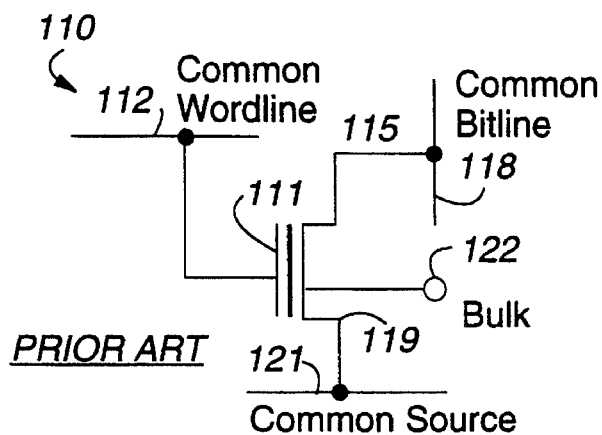
FIGS. 4a and 4b are electrical schematic diagrams of typical single-gate non-volatile memory cells of the prior art, showing their connections to the bitlines and word lines of an associated memory array.
Figure 4B:
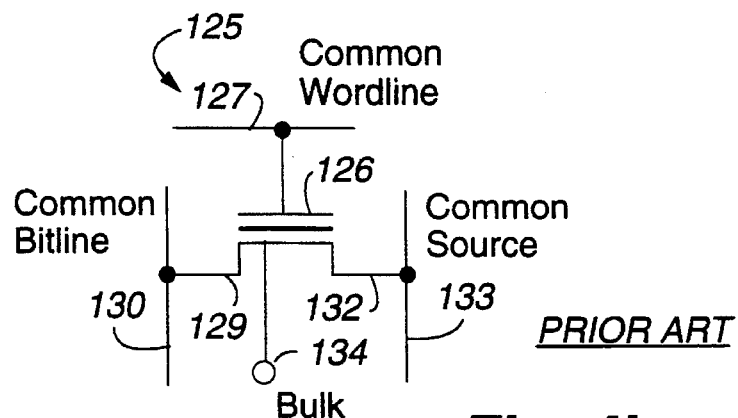

Two examples of typical single-gate non-volatile memory cells of the prior art are shown in FIGS. 4a and 4b. The circuit 110 in FIG. 4a is a cell in an array row of cells in which the gates 111 of the individual memory cells in the row are connected to a single common word line 112 or subword line. The drains 115 of the memory cells in the same column of the cell 110 are tied to a single common bit line 118. The sources 119 of the memory cells in the row of the cell 110 are tied to a single common source line 121. Each of the memory cells in at least a memory array block (or other subset of the entire memory) share the same well structure or substrate; therefore, the bulk connections of the memory cells may be tied to a common well signal 122.

The cell 125 shown in FIG. 4b has its gate 126 connected to the gates of the other memory cells in the same row by a common word line 127 or subword line. The drain 129 of the cell 125 is connected to the drains of the other memory cells in the same column by a single common bit line 130. The source 132 of the memory cell 125 is connected to the sources of the other sources of the other memory cells in the same column by a common source line 133. Each of the memory cells in the memory array block (or other subset of the entire memory) share the same well structure or substrate; therefore, the bulk connections of the memory cells may be connected to a common well signal 134. These structures generally apply to either n-channel or p-channel devices.

As can be seen, the single-gate of the non-volatile memory cells in FIGS. 4a and 4b are connected to the common word line 112 (FIG. 4a) or 127 (FIG. 4b), which in turn connects to the respective SWDs (not shown). The SWDs to which the word lines are connected provide the voltages necessary for the reading, erasing and programming operations of the non-volatile memory cells on the particular word line or subword line.

In accordance with one embodiment of the SWD of the invention, voltages that the SWD provides to perform the reading, erasing, and programming operations for n-channel non-volatile memory cells is shown Table 1. In addition, the SWD of the invention provides a different voltage to inhibit the desired operation from occurring on unselected word lines or subword lines. This is also summarized in the Table 1.

TABLE 1

| Operation | Selected | Deselected |
|---|---|---|
| Reading | $V_r$ | $V_{ss}$ |
| Erasing | $-V_{pp}$ | $V_{cc}$ |
| Programming | $V_{cc}$ | $-V_{pp}$ |

In Table 1, $V_r$ is a voltage that may have a value between $V_{ss}$ and $V_{cc}$ and is used to turn on the selected row, while $V_{ss}$ keeps unselected rows in an off state for reading. $V_{pp}$ is the magnitude of the voltage used for erasing and programing. For an n-channel array, the voltage difference between $V_{cc}$ and $-V_{pp}$ is used in the erasing and programming operations, and this difference usually has a magnitude that is at least the value of $V_{cc}$. Thus, $-V_{pp}$ usually has a negative polarity. For erasing, $-V_{pp}$ is applied to the gate of the selected row and $V_{cc}$ is applied to the unselected row. For programming, $V_{cc}$ is applied to the gate of the selected row and $-V_{pp}$ is applied to the unselected row.

The voltages of the various operations for p-channel non-volatile memory cells are shown in Table 2.

TABLE 2

| Operation | Selected | Deselected |
|---|---|---|
| Reading | $V_r$ | $V_{cc}$ |
| Erasing | $V_{pp}$ | $V_{ss}$ |
| Programming | $V_{ss}$ | $V_{pp}$ |

As with the n-channel array, $V_r$ in the p-channel array also may have a value that is between $V_{ss}$ and $V_{cc}$ that is applied to the gates of the non-volatile memory cells on a selected row, while $V_{cc}$ is applied to the unselected rows for reading. For a p-channel array, the voltage difference between $V_{pp}$ and $V_{ss}$ is used in the erasing and programming operations. $V_{pp}$ usually has a magnitude that is at least the $V_{cc}$ value. For erasing, $V_{pp}$ is applied to the gates of the non-volatile p-channel memory cells on a selected row and $V_{ss}$ is applied to the unselected row. For programming $V_{ss}$ is applied to the selected row and $V_{pp}$ is applied to the unselected row. An example of a non-volatile memory array that can be used, for instance, in conjunction with such operating parameters can be seen in copending patent application entitled "FLASH MEMORY SYSTEM, AND METHODS OF CONSTRUCTING AND UTILIZING SAME", Ser. No. PCT/US93/10485, filed Nov. 2, 1993, by the applicants hereof, and assigned to the assignee hereof, said application being incorporated herein by reference.

Figure 5:
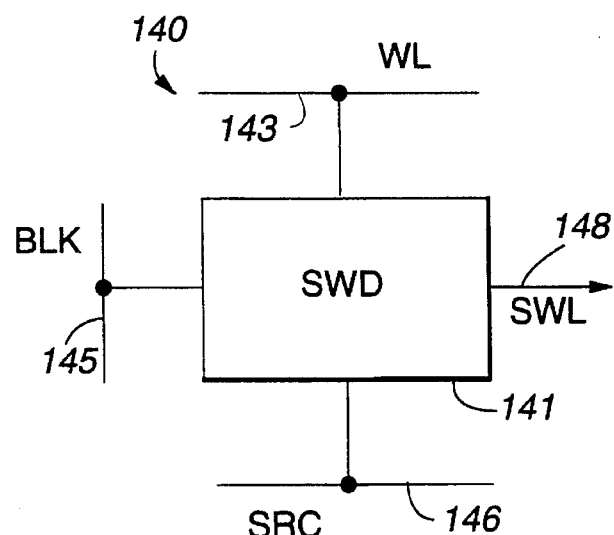
FIG. 5 is a box diagram of the implementation of an SWD that can provide the various operating voltages of a non-volatile memory, in accordance with a preferred embodiment of the invention.

A box diagram of an embodiment 140 of an SWD 141 that can provide the voltages specified in Table 1 or 2 is shown in FIG. 5. The lines on which control signals are carried to the SWD are the word line, WL, 143, block select line, BLK, 145, and common source line, SRC, 146. The output is provided on a subword line, SWL, 148. It should be noted that although the output line is designated as a subword line, SWL, 148, the line WL 143 may be an output of a row decoder (not shown) and may be, for instance, either a word line or an enable signal. Thus, if the signal on the line WL 143 is an enable signal, then the line SWL 148 may be the actual word line. On the other hand, if the line WL 143 is the actual word line, then the line SWL 148 may be the subword line.

The signals on the line BLK 145 can be decoded true and complement enable signals. Because the signals on the line BLK 145 can be decoded, they can select one in a group of sequential word lines or subword lines. This is important since there are times when the row decoders, WLs, or the SWDs cannot fit in the row pitch (usually limited by the polysilicon SWL pitch) of the memory array. In such case, the WL signal need not be placed for every row of memory cells.

The common source signal on line SRC 146 is also an important signal, since this signal designates the path to unselected SWLs. For the operations of Table 1 or 2 to be performed, the voltages on unselected rows of memory cells comes from the signal on the line SRC 146. Also, WL can be thought of as carrying the signal that designates the path to the selected SWL with signals on the line BLK 145 routing the voltage on WL 143 to the proper SWL within a group of SWLs. However, WL 143 also carries signals that designate a path to unselected SWLs when WL is not selected, but the signals on the line BLK 145 enable one SWD per group.

If the WL 143 runs horizontally, SWL 148 also runs horizontally. The line BLK 145 runs orthogonal to the WL 143 and SRC 146 can either run with WL 143 or orthogonal to WL 143. WL 143 will provide input signals into each SWD 141 in a group, and there can be more than one group of SWDs per WL 143.

Table 3 is a summary of the signals and voltage levels during the various operations for an n-channel array of non-volatile memory cells. The signal on the line BLK 145 preferably is a complement signal, but is not limited to only complement signal levels. In fact, in Table 3, the signal on line BLK 145 is represented by a true signal.

TABLE 3

| On Line: | Signals | | |
|---|---|---|---|
| | Read | Erase | Program |
| WL-Select | $V_r$ | $-V_{pp}$ | $V_{cc}$ |
| Deselect | $V_{ss}$ | $V_{cc}$ | $-V_{pp}$ |
| BLK-Select | $V_{cc}$ | $V_{cc}$ | $V_{cc}$ |
| Deselect | $V_{ss}$ | $-V_{pp}$ | $-V_{pp}$ |
| SRC | $V_{ss}$ | $V_{cc}$ | $-V_{pp}$ |
| SWL-Select | $V_r$ | $-V_{pp}$ | $V_{cc}$ |
| Deselect | $V_{ss}$ | $V_{cc}$ | $-V_{pp}$ |

A similar table for a p-channel array of non-volatile memory cells is summarized in Table 4.

TABLE 4

| On Line: | Signals | | |
|---|---|---|---|
| | Read | Erase | Program |
| WL-Select | $V_r$ | $V_{pp}$ | $V_{ss}$ |
| Deselect | $V_{cc}$ | $V_{ss}$ | $V_{pp}$ |
| BLK-Select | $V_{cc}$ | $V_{pp}$ | $V_{pp}$ |
| Deselect | $V_{ss}$ | $V_{ss}$ | $V_{ss}$ |
| SRC | $V_{cc}$ | $V_{ss}$ | $V_{pp}$ |
| SWL-Select | $V_r$ | $V_{pp}$ | $V_{ss}$ |
| Deselect | $V_{cc}$ | $V_{ss}$ | $V_{pp}$ |

It should be noticed that in both Tables 3 and 4, for all operations, the deselected SWLs can get their voltages from either SRC or the deselected voltage of WL. Thus, if BLK 145 is selected, then the deselected SWLs will get its voltage from WL 143. On the other hand, if BLK 145 is deselected, then the deselected SWLs will get their voltages from SRC 146.

Figure 6:
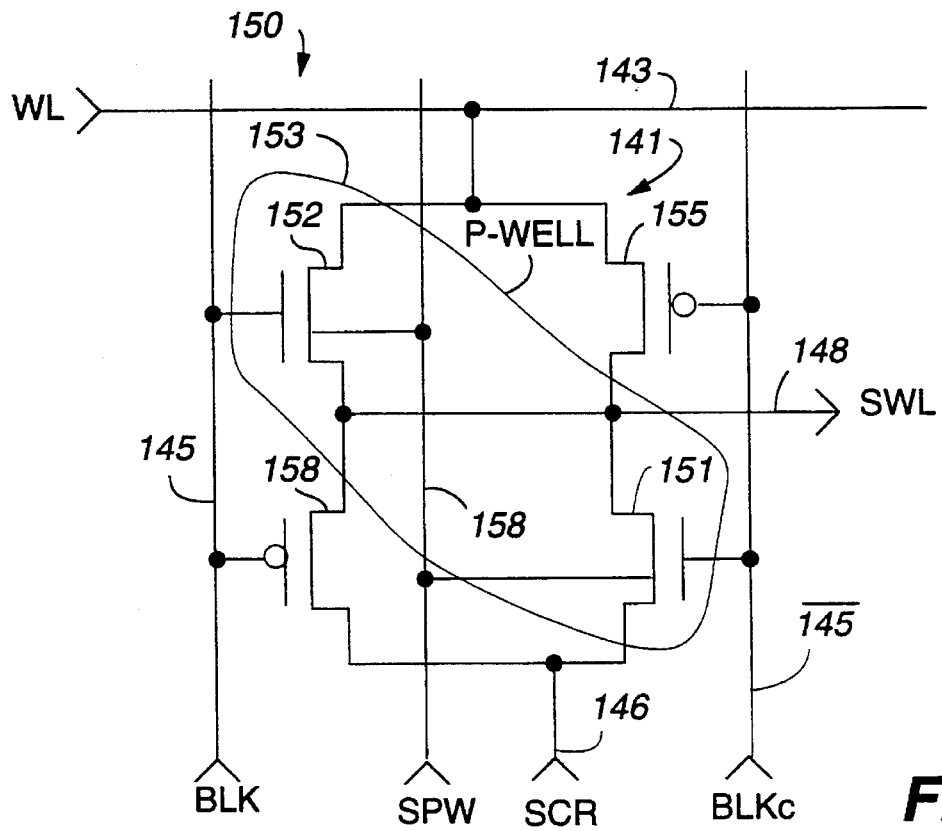
FIG. 6 is an electrical schematic of a preferred embodiment of an SWD for an n-channel array in a p-well.

FIG. 6 shows an electrical schematic of a preferred embodiment of an SWD 150 that can be used to implement the box 141 in the box diagram in FIG. 5, with an n-channel array (not shown) in a p-well 153. The voltages necessary to operate this circuit are summarized in Table 3 described above, except that a complement signal of the signal on the BLK line 145 is provided on a complement line BLKc $\overline{145}$. The SWD circuit 150, for example, may serve as circuitry for providing signals that can be decoded to operate a number of single-gate non-volatile memory cells on a single word line, or subword line, for the purposes of reading or altering the states stored in the non-volatile memory cells.

The circuit 150 has two n-channel MOS (NMOS) transistors 151 and 152 and two p-channel MOS (PMOS) transistors 155 and 156 that are configured to pass the voltage on WL 143 if selected, or pass the voltage on the SRC 146 if not selected by the signals on the lines BLK 145 and BLKc $\overline{145}$. Also, if the WL 143 is deselected, and the signals on the lines BLK 145 and BLKc $\overline{145}$ select the SWD 141, the voltage on SWL 148 will be the same deselect voltage as on WL 143.

The n-channel transistor 152 and the p-channel transistor 155 are in the path from the WL 143 to the SWL 148. The gate of the n-channel transistor 152 is turned on by the signal on the line BLK 145. The drain of the n-channel transistor 152 is connected to WL 143 and its source is connected to the SWL 148. The gate of the p-channel transistor 155 is turned on by the signals on the line BLKc $\overline{145}$, its drain is connected to SWL 148, and its source is connected to the WL 143.

Similarly, an n-channel transistor 151 and a p-channel transistor 156 are connected in the path from the SRC 146 to the SWL 148. The gate of the n-channel transistor 151 is operated by signals on the line BLKc $\overline{145}$, its drain is connected to SWL 148 and its source is connected to the SRC 146. The gate of the p-channel transistor 156 is turned on by signals on the line BLK 145, its drain is connected to SRC 151 and its source is connected to the SWL 148.

The preferred CMOS technology for non-volatile memory arrays that require that the substrate or well voltages be substantially different than those on the gate for erasing and programming operations, allows the voltages in the wells to be changed rather than the substrate voltages. This is preferred since CMOS circuitry on other parts of the substrate is allowed to operate at voltages that are at standard CMOS levels. One example of this arrangement is shown in U.S. Pat. No. 4,769,787, incorporated herein by reference. Therefore, for an n-channel array, a p-well CMOS technology is preferred since the p-well of the array can be brought negative without affecting CMOS circuits on the n-substrate. On the other hand, for a p-channel array, an n-well CMOS technology is preferred since the n-well of the array can be brought above $V_{cc}$ without affecting the p-substrate.

Since the circuit of FIG. 6 controls the gates of n-channel non-volatile memory cells in a p-well, the n-channel devices in the circuit also can be constructed in a separate p-well. During an erase operation, at most, some SWLs will be at a $-V_{pp}$ potential with the rest of the SWLs at $V_{cc}$. A program operation will have at most some SWLs at $V_{cc}$ and the rest at a $-V_{pp}$ potential. Thus, the p-well of n-channel devices need to be at $-V_{pp}$ during both the erase and program operations, and a separate p-well connection, SPW 158, for the SWDs is provided. The SPW line 158 is at $V_{ss}$ during a read operation.

Figure 7:
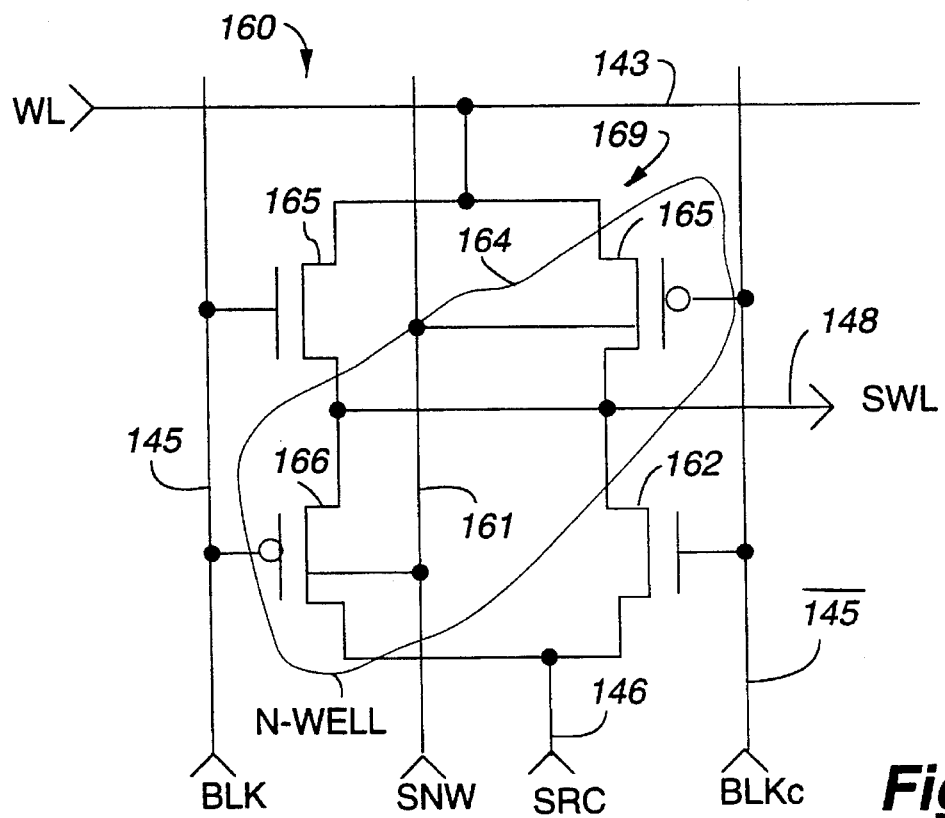
FIG. 7 is an electrical schematic of a preferred embodiment of an SWD for a p-channel array in an n-well.

An SWD circuit 160 for a p-channel array in an n-well is shown in FIG. 7. This SWD is similar to the circuit described above with reference to FIG. 6, except a connection is provided to the n-well via line SNW 161 to the p-channel devices in the SWD. With this connection, $V_{pp}$ values greater than $V_{cc}$ are possible without affecting the p-substrate.

The circuit 160 has two n-channel transistors 162 and 163 and two p-channel transistors 165 and 166 that are configured to pass the voltage on WL 143 if selected (by the signals on the lines BLK 145 and BLKc $\overline{145}$) or pass the voltage on the SRC 146 if not selected. Also, if the WL 143 is deselected, and the signals on the lines BLK 145 and BLKc $\overline{145}$ select the SWD 169, the voltage on SWL 148 will be the same voltage as on WL 143.

The n-channel transistor 163 and the p-channel transistor 165 are in the path from the WL 143 to the SWL 148. The gate of the n-channel transistor 163 is turned on by the signal on the line BLK 145. The drain of the n-channel transistor 163 is connected to WL 143 and its source is connected to the SWL 148. The gate of the p-channel transistor 165 is turned on by the signals on the line BLKc $\overline{145}$, its drain is connected to SWL 148, and its source is connected to the WL 143.

Similarly, an n-channel transistor 162 and a p-channel transistor 166 are connected in the path from the SRC 146 to the SWL 148. The gate of the n-channel transistor 162 is operated by signals on the line BLKc $\overline{145}$, its drain is connected to SWL 148 and its source is connected to the SRC 146. The gate of the p-channel transistor 166 is turned on by signals on the line BLK 145, its drain is connected to SRC 146 and its source is connected to the SWL 148.

Figure 8:
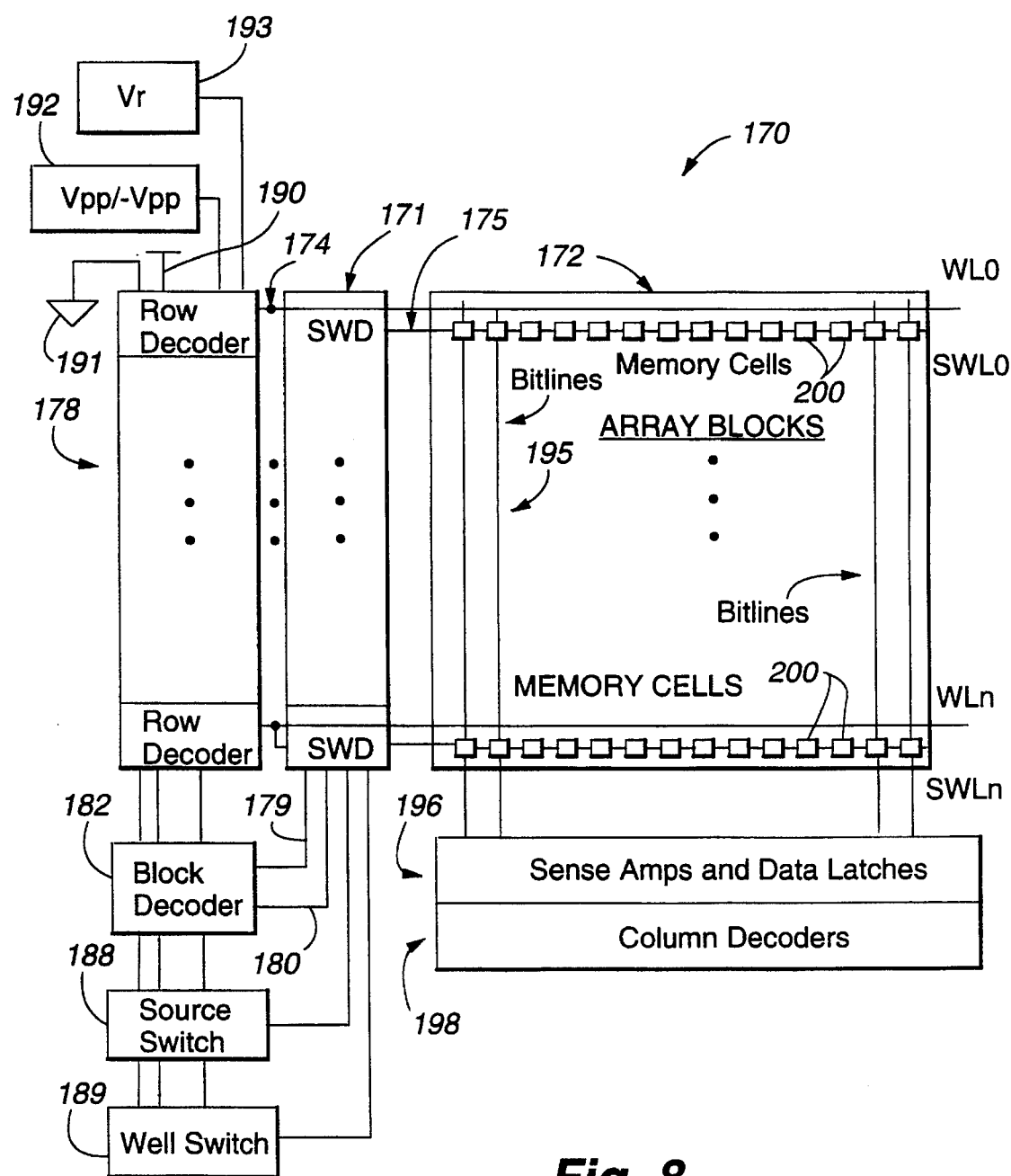
FIG. 8 is a block diagram of an array constructed using the SWD of FIGS. 6 or 7, in accordance with a preferred embodiment of the invention.

An array constructed using the SWD of FIGS. 6 or 7 is shown in FIG. 8. It should be noted that the array 170 is configured in a basic way that has a group of SWDs 171 controlling the SWLs of an array block 172. The outputs of the row decoders 178 and WLs 174, together with the block signals, BLK 179 and BLKc 180 from the block decoder 182 enable a single SWD 171 to output on its SWL 175 select signals to the array block 172. The memory array configuration can become more complicated by having more than one array block with its own SWDs and BLK and BLKc signals but with common WL signals. In addition, there can be more than one set of SWDs and BLK and BLKc signals per array block that select groups of SWLs. The SWLs within a group can physically be together or they can be interleaved with other SWLs of other groups. The different groups in an array block can have common WL connections.

The signal inputs to the row decoder 178, block decoder 182, source switch 188 and the SWD well switch 189 as shown include power supply signals $V_{cc}$ 190, $V_{ss}$ 191, and erase/program voltage $V_{pp}$ or $-V_{pp}$ which can be generated on or off chip from a generator 192. The signal $V_r$ 193 is connected to the row decoder 178, since it is the select signal that is routed to the SWDs 171 through the WLs 174. The signal $V_r$ 193 also can be generated on or off chip. The vertical bitlines 195 shown, along with the sense amps and data latches 196, and column decoders 198 are independent of how the SWDs function and are configured.

Thus, the array 170 provides an output from an SWD circuit 171 onto a subword line 175 to present voltages required to read, erase and program non-volatile memory cells 200 connected to the SWL in the array 172. If the memory cells are of n-channel non-volatile memory cells in a p-well the voltage levels that may be seen on the SWL 175 are: $V_{cc}$ used during erase and program operations; one that has a magnitude greater than $V_{cc}$ and referenced negative from $V_{cc}$ used during the erase and program operations; $V_{ss}$ for deselected SWLs during a read operation; and $V_r$ that is between $V_{ss}$ and $V_{cc}$ for the selected SWL of a read operation. $V_{ss}$ can be at ground or a negative potential.

On the other hand, the voltage levels that may be seen on the SWL 175 of p-channel non-volatile memory cells in an n-well are: $V_{ss}$ used during erase and program operations; one that has a magnitude greater than $V_{cc}$ and referenced positive from $V_{ss}$ used during the erase and program operations; $V_{cc}$ for deselected SWLs during a read operation; and $V_r$ that is between the Vss and Vcc levels for the selected SWL of a read operation.

It should be noted that although the invention is described in the context of semiconductor structures having certain conductivity type, and of certain materials, the particular materials and conductivity types disclosed are only exemplary, and that those skilled in the art will recognize that other types of materials having the same or different conductivity types may be equally advantageously employed. For example, the invention can be carried out on semiconductors other than silicon, can have either n-type or p-type dopants, can have various doping levels, etc.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A semiconductor memory array, comprising:

two memory blocks, each having a plurality of rows of memory cells;

a word line that extends into said two memory blocks;

a word line driver for providing drive signals to said word line;

two pairs of subword lines each subword line of each pair being associated with memory cells of a respective one of said plurality of rows of memory cells in a respective one of said blocks;

two pairs of subword line drivers, each pair connected to opposite ends of said word line within a respective one of said two blocks, each subword line driver selectively delivering drive signals from said word line to a respective one of said subword lines;

and a plurality of selection signal lines, each selection signal line connected to select a respective one of said subword line drivers to control delivery of drive signals from said word line to said respective one of said subword lines.

2. The semiconductor memory array of claim 1 wherein said drive signals include read select and deselect signals, erase select and deselect signals, and program select and deselect signals.

3. The semiconductor memory array of claim 1 wherein said subword lines are located on opposite sides of said word line.

4. The semiconductor memory array of claim 1 wherein said selection signal lines are oriented orthogonally to said word line at opposite ends of said word line within a respective one of said two blocks.

5. The semiconductor memory array of claim 1 wherein said word line is metal.

6. The semiconductor memory array of claim 1 wherein said subword lines are polysilicon.

7. The semiconductor memory array of claim 1 further comprising two additional pair of subword lines, each subword line of each additional pair being associated with memory cells of a respective additional one of said plurality of rows of memory cells in a respective one of said blocks, two additional pair of subword line drivers, each additional pair connected to opposite ends of said word line within a respective one of said two blocks, each additional subword line driver selectively delivering drive signals from said word line to a respective one of said additional subword lines, and an additional plurality of selection signal lines, each additional selection signal line connected to select a respective one of said additional subword line drivers to deliver drive signals from said word line to said respective additional one of said subword lines.

8. The semiconductor memory array of claim 7 wherein each subword line of each additional subword line pair, and each subword line driver of each additional subword line driver pair are located on opposite sides of said word line.

9. A semiconductor memory array, comprising:
 a plurality of memory blocks, each having a plurality of rows of memory cells;
 a plurality of word lines, each extending across at least two of said plurality of memory blocks;
 a plurality of word line drivers, each for providing drive signals to a respective one said word lines;
 a plurality of subword line pairs, each pair associated with a respective one of said word lines within a respective one of said memory blocks, each subword line being associated with memory cells of a respective one of said plurality of rows of memory cells in said respective one of said blocks;
 a plurality of pairs of subword line drivers, each pair connected to opposite ends of one of said plurality of word lines within a respective one of said plurality of blocks, each subword line driver selectively delivering drive signals from said word line to a respective one of said subword lines;
 and a plurality of selection signal lines, each selection signal line connected to a respective one of said subword line drivers to control delivery of drive signals from said word line to said respective one of said subword lines.

10. The semiconductor memory array of claim 9 wherein said drive signals include read select and deselect signals, erase select and deselect signals, and program select and deselect signals.

11. The semiconductor memory array of claim 9 wherein each of said selection signal lines connects to every other subword line driver within each block.

12. The semiconductor memory array of claim 9 wherein said subword lines of each pair of subword lines are located on opposite sides of a portion of said word line within a respective one of said memory blocks.

13. The semiconductor memory array of claim 9 wherein said selection signal lines are oriented orthogonally to said word lines at opposite ends of said word line within respective ones of said memory blocks.

14. The semiconductor memory array of claim 9 wherein said word lines are metal.

15. The semiconductor memory array of claim 9 wherein said subword lines are polysilicon.

16. The semiconductor memory array of claim 9 further comprising two additional pair of subword lines, each subword line of each additional pair being associated with memory cells of a respective additional one of said plurality of rows of memory cells in a respective one of said memory blocks, two additional pair of subword line drivers, each additional pair of subword line drivers connected to opposite ends of said word line within a respective one of said memory blocks, each additional subword line driver selectively delivering drive signals from said word line to a respective one of said additional subword lines, and an additional plurality of selection signal lines, each additional selection signal line connected to select a respective one of said additional subword line drivers to deliver drive signals from said word line to said respective additional one of said subword lines.

17. The semiconductor memory array of claim 16 wherein each subword line of each additional subword line pair, and each subword line driver of each additional subword line driver pair are located on opposite sides of a portion of said word line within a respective one of said memory blocks.

18. A method for arranging word lines of a semiconductor memory array of the type having two memory blocks, each block having a plurality of rows of memory cells, comprising the steps of:
 providing a word line extending into said two memory blocks;
 providing a word line driver to supply drive signals to said word line;
 arranging two pairs of subword lines to associate with memory cells of a respective one of said plurality of rows of memory cells in a respective one of said blocks;
 connecting a respective subword line driver of two pairs of subword line drivers to a respective one of said subword lines, with each subword line driver of each pair being located at opposite ends of said word line within a respective one of said two blocks;
 and connecting each of a plurality of selection signal lines to select a respective one of said subword line drivers to control delivery of drive signals from said word line to said respective one of said subword lines.

19. The method of claim 18 wherein said drive signals include read select and deselect signals, erase select and deselect signals, and program select and deselect signals.

20. The method of claim 18 wherein said step of arranging two pairs of subword lines comprises arranging said subword lines of each pair on opposite sides of a respective portion of said word line within one of said two memory blocks.

21. The method of claim 18 wherein said step of arranging two pairs of subword lines comprising arranging said subword lines of each pair on a same side of a respective portion of said word line within one of said two memory blocks.

22. The method of claim 18 wherein said step of connecting a plurality of selection signals lines comprises orienting said selection signal lines orthogonally to said word line at opposite ends of said word line within respective ones of said two memory blocks.

23. A subword line driver circuit for use in a semiconductor memory array having at least two blocks of memory cells, a word line, a subword line, first and second block select lines, and a common source line, comprising:
 a first NMOS transistor having a gate, a drain, and a source;
 a first PMOS transistor having a gate, a drain, and a source;
 the drain of the first NMOS transistor and the source of the first PMOS transistors being connected to the word line, the source of the first NMOS transistor and drain of the first PMOS transistor being connected to receive a signal from the common source line, the gate of the first NMOS transistor being connected to the first block select line, and the gate of the first PMOS transistor being connected to the second block select line.

24. The subword line driver circuit of claim 23 wherein said first block select line is a true block select line and said second block select line is a complement block select line.

25. The subword line driver circuit of claim 23 wherein said first block select line is a complement block select line and said second block select line is a true block select line.

26. The subword line driver circuit of claim 23 further comprising:
   a second NMOS transistor having a gate, a drain, and a source;
   a second PMOS transistor having a gate, a drain, and a source;
   the drain of the second NMOS transistor and the source of the second PMOS transistor being connected to the drain respectively of the first PMOS transistor and the source of the first NMOS transistor, the source of the second NMOS transistor and the drain of the second PMOS transistors being connected to receive a signal on the common source line, the gate of the second NMOS transistor being connected to the second block select line, and the gate of the second PMOS transistor being connected to the first block select line.

27. The subword line driver circuit of claim 23 wherein the memory cells are constructed in a well of p-type conductivity in a semiconductor substrate and further comprising separate connections to the well and to the channel of the NMOS transistor.

28. The subword line driver circuit of claim 23 wherein the memory cells are constructed in a well of n-type conductivity in a semiconductor substrate and further comprising separate connections to the well and to the channel of the PMOS transistor.

29. A subword line driver circuit for use in a semiconductor memory array having at least two blocks of memory cells, a word line, a subword line, a block select line, a block complement select line, and a common source line, comprising:
   first and second NMOS transistors, each having a gate, a drain, and a source;
   first and second PMOS transistors, each having a gate, a drain, and a source;
   the drain of the first NMOS transistor and the source of the first PMOS transistor being connected to the word line, the source of the first NMOS transistor and the drain of the first PMOS transistor being connected to the respective source of the second PMOS transistor and the drain of the second NMOS transistor, the gates of the first NMOS transistor and second PMOS transistor being connected to the block select line, and the gates of the second NMOS transistor and first PMOS transistor being connected to the block complement select line.

30. The subword line driver circuit of claim 29 wherein the memory cells are constructed in a well of p-type conductivity in a semiconductor substrate and further comprising separate connections to the well and to the channels of the first and second NMOS transistors.

31. The subword line driver circuit of claim 29 wherein the memory cells are constructed in a well of n-type conductivity in a semiconductor substrate and further comprising separate connections to the well and to the channels of the first and second PMOS transistors.

32. A semiconductor memory array, comprising:
   two memory blocks, each having a plurality of rows of memory cells;
   a word line that extends into said two memory blocks;
   a word line driver for providing drive signals to said word line;
   two pairs of subword lines each subword line of each pair being associated with memory cells of a respective one of said plurality of rows of memory cells in a respective one of said blocks;
   two pairs of subword line drivers, each pair connected to opposite ends of said word line within a respective one of said two blocks, each subword line driver selectively delivering drive signals from said word line to a respective one of said subword lines;
   a plurality of selection signal lines, each selection signal line connected to select a respective one of said subword line drivers to control delivery of drive signals from said word line to said respective one of said subword lines;
   each of said subword drivers comprising:
   first and second NMOS transistors, each having a gate, a drain, and a source;
   first and second PMOS transistors, each having a gate, a drain, and a source;
   the drain of the first NMOS transistor and the source of the first PMOS transistor being connected to the word line, the source of the first NMOS transistor and the drain of the first PMOS transistor being connected to the respective source of the second PMOS transistor and the drain of the second NMOS transistor the source of the first NMOS transistor and the drain of the first PMOS transistor being also connected to one of said subword lines, the drain of said second PMOS transistor and the source of said second NMOS transistor being connected to a common source line, the gates of the first NMOS transistor and second PMOS transistor being connected to one of said block selection lines, and the gates of the second NMOS transistor and first PMOS transistor being connected to a complement selection line.

33. The semiconductor memory array of claim 32 wherein said drive signals include read select and deselect signals, erase select and deselect signals, and program select and deselect signals.

34. The semiconductor memory array of claim 32 wherein said subword lines are located on opposite sides of said word line.

35. The semiconductor memory array of claim 32 wherein said selection signal lines are oriented orthogonally to said word line at opposite ends of said word line within respective ones of said two blocks.

36. The semiconductor memory array of claim 32 wherein said word line is metal.

37. The semiconductor memory array of claim 32 wherein said subword lines are polysilicon.

38. A word line driver circuit for use in a semiconductor memory array having at least two blocks of memory cells, comprising:
   a first word line for supplying signals for delivery to a selected memory cell;
   a source line for supplying signals for delivery to a deselected memory cell;
   a first block select line for carrying true block select signals;
   a second block select line for carrying complement block select signals;
   a second word line for delivering signals selected from said first word line and said source line to a plurality of memory cells in said at least two blocks;
   first and second NMOS transistors, each having a gate, a drain, and a source;

first and second PMOS transistors, each having a gate, a drain, and a source;

the drain of the first NMOS and source of the first PMOS transistors being connected to the first word line, the source of the first NMOS and drain of the first PMOS transistors being connected to the second word line and to the drain respectively of the second NMOS and source of the second PMOS transistors; the gates of the first NMOS transistor and the second PMOS transistor being connected to the first block select line, and the gates of the first PMOS transistor and the second NMOS transistor being connected to the second block select line, and the source of the second NMOS and drain of the second PMOS transistors being connected to the source line, whereby said second word line delivers signals selected from said first word line and said source line to said memory cells in dependence upon the true and complement block select signals on said first and second block select lines.

39. The word line driver circuit of claim 38 wherein the memory cells are constructed in a well of p-type conductivity in a semiconductor substrate and further comprising separate connections to the well and to the channels of the NMOS transistors.

40. The word line driver circuit of claim 38 wherein the memory cells are constructed in a well of n-type conductivity in a semiconductor substrate and further comprising separate connections to the well and to the channels of the PMOS transistors.

41. The word line driver circuit of claim 38 wherein the first word line is a main word line, and the second word line is a subword line.

42. The word line driver circuit of claim 38 wherein the first word line is an enable signal line, and the second word line is a main word line.

* * * * *